(12) United States Patent
Li et al.

(10) Patent No.: US 12,638,482 B2
(45) Date of Patent: May 26, 2026

(54) POWER DETECTION CIRCUIT HAVING TEMPERATURE COMPENSATION FUNCTION, AND RADIO-FREQUENCY FRONT-END MODULE COMPRISING POWER DETECTION CIRCUIT

(71) Applicant: VANCHIP (TIANJIN) TECHNOLOGY CO., LTD., Tianjin (CN)

(72) Inventors: Hao Li, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 162 days.

(21) Appl. No.: 18/415,658

(22) Filed: Jan. 18, 2024

(65) Prior Publication Data

US 2024/0230734 A1 Jul. 11, 2024

Related U.S. Application Data

(63) Continuation of application No. PCT/CN2023/072797, filed on Jan. 18, 2023.

(51) Int. Cl.
*G01R 21/14* (2006.01)
(52) U.S. Cl.
CPC ................................... *G01R 21/14* (2013.01)
(58) Field of Classification Search
CPC ................................ G01R 21/14; G05F 1/567
See application file for complete search history.

(56) References Cited

U.S. PATENT DOCUMENTS

| | | | | |
|---|---|---|---|---|
| 6,819,091 B2 * | 11/2004 | Ishihara | ................ | H02M 3/155 |
| | | | | 361/103 |
| 7,030,600 B2 * | 4/2006 | Adlerstein | ............. | G01R 21/02 |
| | | | | 324/725 |
| 2002/0175751 A1 * | 11/2002 | McMorrow | .......... | H03G 3/3042 |
| | | | | 330/129 |
| 2003/0042885 A1 * | 3/2003 | Zhou | ...................... | G01R 21/14 |
| | | | | 324/105 |
| 2011/0018609 A1 * | 1/2011 | Chou | ................ | H02M 3/33507 |
| | | | | 327/513 |
| 2018/0262166 A1 * | 9/2018 | Takagi | .................... | H03F 3/245 |

* cited by examiner

*Primary Examiner* — Huy Q Phan
*Assistant Examiner* — Haidong Zhang
(74) *Attorney, Agent, or Firm* — George Guosheng Wang; Upstream Research and Patent LLC

(57) ABSTRACT

A power detection circuit (3) having a temperature compensation function, and a radio-frequency front-end module comprising the power detection circuit. The power detection circuit (3) comprises at least one Stage of power detection unit (Stage 1, Stage 2, Stage 3) and an integration unit (Sum), wherein an input end of the integration unit (Sum) is connected to an output end of the power detection unit (Stage 1, Stage 2, Stage 3); a resistor which is connected to a bias voltage in the power detection unit (Stage 1, Stage 2, Stage 3) is a thermistor, and/or a resistor which is connected to a reference ground potential in the integration unit (Sum) is a thermistor. The technical problem of requiring a plurality of bias voltages (Vreg) with different temperature coefficients to supply power due to different circuit modules having different requirements for temperature coefficients of bias voltages (Vreg) is solved.

12 Claims, 6 Drawing Sheets

POWER DETECTION CIRCUIT HAVING TEMPERATURE COMPENSATION FUNCTION, AND RADIO-FREQUENCY FRONT-END MODULE COMPRISING POWER DETECTION CIRCUIT

BACKGROUND

Technical Field

The present invention relates to a power detection circuit having a temperature compensation function, in addition, relates to a radio frequency front-end module and a corresponding electronic device that include the power detection circuit, and relates to the field of radio frequency integrated circuit technologies.

Related Art

A radio frequency front-end (RF FE for short) module is a core component of an electronic device such as a smartphone, and is mainly configured to implement sending and receiving of radio frequency signals at different frequency. A typical radio frequency front-end module includes components such as a radio frequency switch, a low noise amplifier, a filter, a diplexer, and a power amplifier.

As shown in FIG. 1, in an example of a conventional radio frequency front-end module, a power amplifier including three stages of power amplification units (PA1 to PA3), a power supply circuit, and a power detection circuit are included. A power supply is responsible for providing the power amplifier with power supply needed for operation. The power amplifier is responsible for amplification and processing of a radio frequency signal. A function of the power detection circuit is to convert power of a radio frequency front end into a corresponding voltage value, and feed the value back to a processor of an electronic device to calibrate output power.

In the conventional technology, a radio frequency front-end module used in an electronic device usually requires a working environment temperature that ranges from −25° C. to 85° C., or from −40° C. to 110° C. Generally, to compensate for performance difference of an HBT (heterojunction bipolar transistor) at high and low temperatures, a temperature compensation circuit with a negative temperature coefficient needs to be provided in a power supply, to adjust a voltage for supplying power to an HBT, thereby compensating temperature characteristics of the HBT. For the power detection circuit integrated in a process of the HBT, a voltage with a temperature coefficient is needed to adjust correspondence curves between input power and output voltages of the power detection circuit at different temperatures, so that output power at different temperatures is stable. However, a conventional radio frequency front-end module often has a plurality of voltages, and requirements for temperature coefficients of voltages of different circuit modules are different, so that a plurality of voltages with different temperature coefficients are needed to respectively supply power to different circuit modules. This increases complexity of a circuit design and greatly increases production costs of the radio frequency front-end module.

SUMMARY

A technical problem to be resolved in the present invention is to provide a power detection circuit having a temperature compensation function.

Another technical problem to be resolved in the present invention is to provide a radio frequency front-end module and an electronic device that include the power detection circuit.

To achieve the foregoing objectives, the following technical solutions are used in the present invention.

According to a first aspect of an embodiment of the present invention, a power detection circuit having a temperature compensation function is provided. The power detection circuit includes at least one stage of power detection unit and an integrated unit. An input end of the integrated unit is connected to an output end of the power detection unit.

A resistor connected to a bias voltage in the power detection unit is a thermistor, and/or a resistor connected to a reference ground potential in the integrated unit is a thermistor.

Preferably, the bias voltage is a voltage having a temperature coefficient.

Preferably, the integrated unit includes a seventh HBT, a tenth capacitor, a tenth resistor, an eleventh resistor, a twelfth resistor, and a thirteenth resistor. The output end of the power detection unit is connected to a base of the seventh HBT. A collector of the seventh HBT is connected to the bias voltage. An emitter of the seventh HBT is connected to the reference ground potential via the eleventh resistor, and is connected to an output end of the integrated unit via the twelfth resistor. Two ends of the tenth resistor are respectively connected to the base and the collector of the seventh HBT. One end of the thirteenth resistor is connected to the reference ground potential, and the other end of the thirteenth resistor is connected to the output end. One end of the tenth capacitor is connected to the emitter of the seventh HBT, and the other end of the tenth capacitor is connected to the reference ground potential.

Preferably, the tenth resistor in the integrated unit and the bias voltage both have positive temperature coefficients or negative temperature coefficients.

Preferably, in the integrated unit, the following formula is satisfied:

$$V7e = (Vreg - Vbe7) - I \times R10.$$

V7e is a voltage of the emitter of the seventh HBT, Vreg is the bias voltage, Vbe7 is a voltage between the base and emitter of the seventh HBT, R10 is a resistance value of the tenth resistor, and I is an output current of the power detection unit.

Preferably, the power detection unit includes a first HBT, a second HBT, a first capacitor, a second capacitor, a third capacitor, a first resistor, a second resistor, and a seventh resistor. A signal input end of the power detection circuit is connected to the first capacitor. The other end of the first capacitor is connected to the first resistor and a collector of the first HBT. The other end of the first resistor is connected to a base of the first HBT. An emitter of the first HBT is connected to the reference ground potential. The collector of the first HBT is connected to the bias voltage via the seventh resistor, and is connected to a base of the second HBT via the second resistor. An emitter of the second HBT is connected to the reference ground potential, and a collector of the second HBT is connected to the input end of the integrated unit. One end of the second capacitor is connected to the first resistor, and the other end of the second capacitor is connected to the emitter of the first HBT. One end of the third capacitor is connected to the second resistor, and the other end of the third capacitor is connected to the emitter of the second HBT.

Preferably, when the seventh resistor connected to the bias voltage in the power detection unit has a positive temperature coefficient, the bias voltage has a negative temperature coefficient. Alternatively, when the seventh resistor connected to the bias voltage in the power detection unit has a negative temperature coefficient, the bias voltage has a positive temperature coefficient.

Preferably, when there are at least two stages of power detection units, collectors of second HBTs in the power detection units are used as output ends of the stages of power detection units and jointly connected to the input end of the integrated unit.

According to a second aspect of an embodiment of the present invention, a radio frequency front-end module is provided. The radio frequency front-end module includes the foregoing power detection circuit.

According to a third aspect of an embodiment of the present invention, an electronic device is provided. The electronic device includes the foregoing power detection circuit.

Compared with the conventional technology, the technical solutions that the power detection circuit with the temperature compensation function provided in the present invention uses a power supply circuit with a single output voltage to provide a bias power supply needed for operation for two or more stages of power amplification units and one or more stages of power detection units resolve the technical problem that requirements for temperature coefficients of bias voltages Vreg of different circuit modules are different, so that a plurality of bias voltages Vreg with different temperature coefficients are needed for power supply. Therefore, the power detection circuit and the radio frequency front-end module thereof provided in the present invention have beneficial effects such as a simple structural design, reduced production costs, and reliable performance in use.

DETAILED DESCRIPTION

The technical solutions of the present invention are further described below in detail with reference to the accompanying drawings and specific embodiments.

Figure 1:
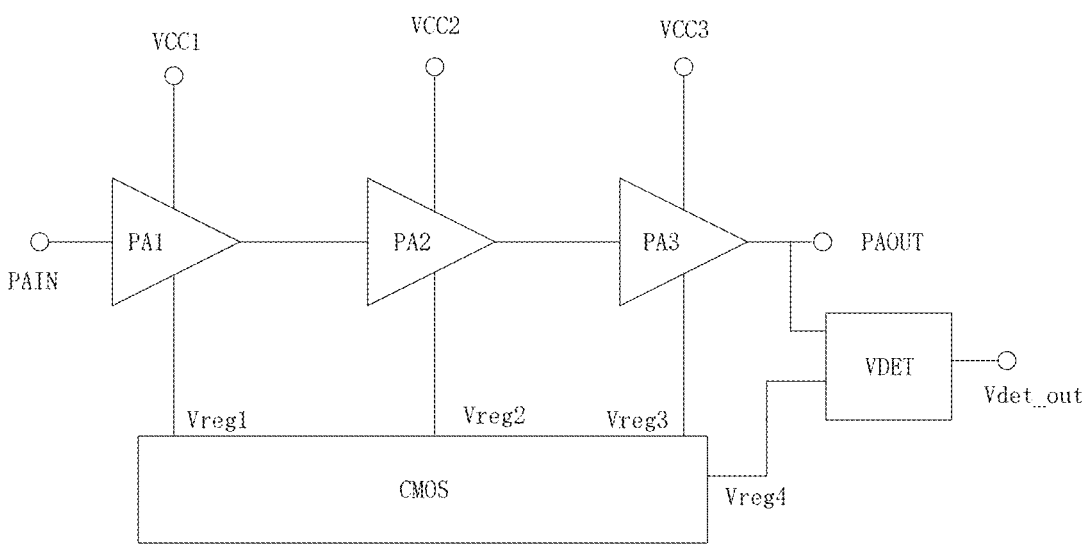
FIG. 1 is an example diagram of a typical radio frequency front-end module in the conventional technology.
Figure 2:
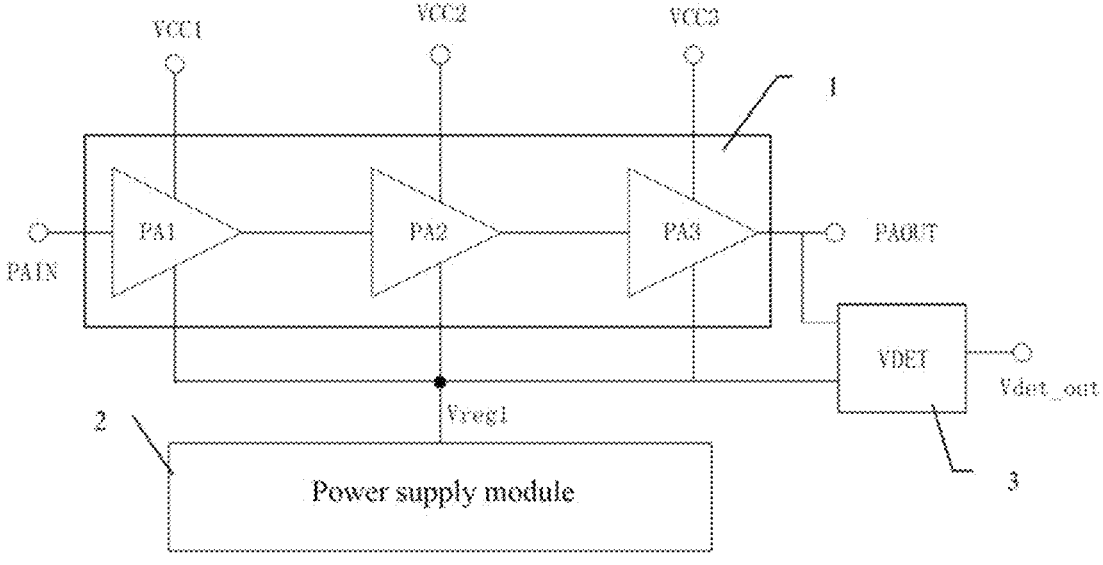
FIG. 2 is a schematic diagram of a circuit of a radio frequency front-end module according to an embodiment of the present invention.

As shown in FIG. 2, a radio frequency front-end module provided in an embodiment of the present invention includes a power amplifier 1, a power supply circuit 2, and a power detection circuit (VDET for short) 3. An output end of the power amplifier 1 is connected to an input end of the power detection circuit 3. An output end of the power supply circuit 2 is separately connected to bias power supply ends of the power amplifier 1 and the power detection circuit 3. The power supply circuit 2 provides bias voltages and currents needed for operation of the power amplifier 1 and the power detection circuit 3. The power detection circuit 3 detects output power of the power amplifier 1 and converts the output power into an output voltage (Vdet_out) proportional to the power.

In one embodiment of the present invention, the power amplifier 1 is preferably implemented by a component through a III-V compound process. The power amplifier 1 includes three stages of power amplification units, which are a first-stage power amplification unit PA1, a second-stage power amplification unit PA2, and a third-stage power amplification unit PA3. An input end (PAIN) of the first-stage power amplification unit PA1 is connected to an external radio frequency signal. An output end of the first-stage power amplification unit PA1 is connected to an input end of the second-stage power amplification unit PA2. An output end of the second-stage power amplification unit PA2 is connected to an input end of the third-stage power amplification unit PA3. An output end of the third-stage power amplification unit PA3 is connected to the input end of the power detection circuit 3.

In one embodiment of the present invention, the power supply circuit 2 is preferably implemented by a component through a CMOS or an SOI process. The power supply circuit 2 outputs a bias voltage Vreg1, which separately provides bias voltages for operation of the three stages of power amplification units in the power amplifier 1 and the power detection circuit 3.

Figure 3:
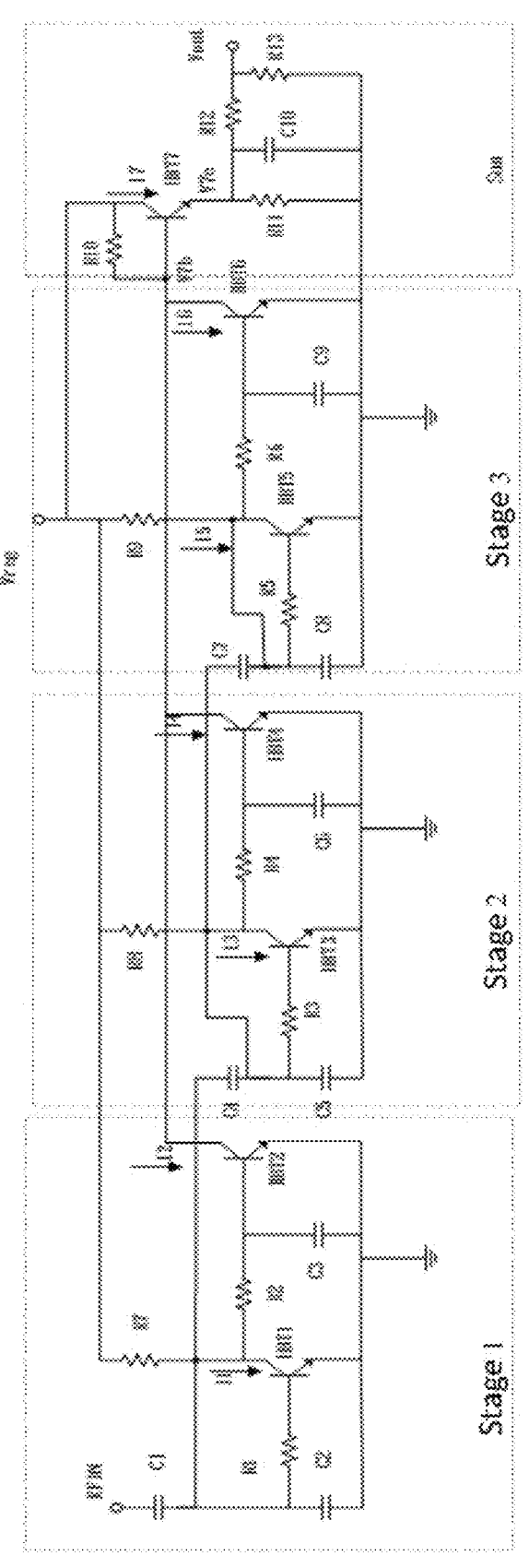
FIG. 3 is a schematic diagram of a circuit of an embodiment of a power detection circuit in the radio frequency front-end module as shown in FIG. 2.

As shown in FIG. 3, the power detection circuit 3 provided in the present invention is a power detection circuit having a temperature compensation function, including three stages of power detection units and an integrated unit Sum. The three stages of power detection units are respectively a first-stage power detection unit Stage 1, a second-stage power detection unit Stage 2, and a third-stage power detection unit Stage 3. Each stage of power detection unit includes two HBTs, three capacitors, and three resistors. The integrated unit Sum includes an HBT, a capacitor, and four resistors. To achieve the temperature compensation function, resistors connected to the bias voltage Vreg in each stage of power detection unit and the integrated unit are thermistors, and/or resistors connected to a reference ground potential (a ground terminal, the same below) in the integrated unit are also thermistors.

In an embodiment shown in FIG. 3, the first-stage power detection unit Stage 1 includes a first HBT 1 and a second HBT 2, a first capacitor C1, a second capacitor C2, a third capacitor C3, a first resistor R1, a second resistor R2, and a seventh resistor R7. The seventh resistor R7 is a thermistor.

A signal input end RFIN of the power detection circuit is connected to the first capacitor C1. The other end of the first capacitor C1 is connected to the first resistor R1 and a collector of the first HBT 1. The other end of the first resistor R1 is connected to a base of the first HBT 1. An emitter of the first HBT 1 is connected to the reference ground potential. The collector of the first HBT 1 is connected to the bias voltage Vreg via the seventh resistor R7, and is connected to a base of the second HBT 2 via the second resistor R2. An emitter of the second HBT 2 is connected to the reference ground potential. A collector of the second HBT 2 is used as an output end of the stage of power detection unit and is connected to output ends of the second-stage power detection unit and the third-stage power detection unit, and then the collector and the output ends are jointly connected to the input end of the integrated unit. One end of the second capacitor C2 is connected to the first resistor R1. The other end of the second capacitor C2 is connected to the emitter of the first HBT 1. One end of the third capacitor C3 is connected to the second resistor R2. The other end of the third capacitor C3 is connected to the emitter of the second HBT 2.

In the embodiment shown in FIG. 3, the second-stage power detection unit Stage 2 includes a third HBT 3, a fourth HBT 4, a first capacitor C4, a fifth capacitor C5, a sixth capacitor C6, a third resistor R3, a fourth resistor R4, and an eighth resistor R8. The eighth resistor R8 is a thermistor. The signal input end RFIN of the power detection circuit is connected to the fourth capacitor C4 of the second-stage power detection unit via the first capacitor C1 of the first-stage power detection unit. The other end of the fourth capacitor C4 is connected to the third resistor R3 and a collector of the third HBT 3. The other end of the third resistor R3 is connected to a base of the third HBT 3. An emitter of the third HBT 3 is connected to the reference ground potential. The collector of the third HBT 3 is connected to the bias voltage Vreg via the eighth resistor R8, and is connected to a base of the fourth HBT 4 via the fourth resistor R4. An emitter of the fourth HBT 4 is connected to the reference ground potential. A collector of the fourth HBT 4 is connected to output ends of the first-stage power detection unit and the third-stage power detection unit, and then the collector and the output ends are jointly connected to the input end of the integrated unit. One end of the fifth capacitor C5 is connected to the third resistor R3, and the other end of the fifth capacitor C5 is connected to the emitter of the third HBT 3. One end of the sixth capacitor C6 is connected to the fourth resistor R4, and the other end of the sixth capacitor C6 is connected to the emitter of the fourth HBT 4.

In the embodiment shown in FIG. 3, the third-stage power detection unit Stage 3 includes a fifth HBT 5, a sixth HBT 6, a seventh capacitor C7, an eighth capacitor C8, a ninth capacitor C9, a fifth resistor R5, a sixth resistor R6, and a ninth resistor R9. The ninth resistor R9 is a thermistor. The signal input end RFIN of the power detection circuit is connected to the seventh capacitor C7 of the third-stage power detection unit via the first capacitor C1 of the first-stage power detection unit and the fourth capacitor C4 of the second-stage power detection unit. The other end of the seventh capacitor C7 is connected to the fifth resistor R5 and a collector of the fifth HBT 5. The other end of the fifth resistor R5 is connected to a base of the fifth HBT 5. An emitter of the fifth HBT 5 is connected to the reference ground potential. A collector of the fifth HBT 5 is connected to the bias voltage Vreg via the ninth resistor R9, and is connected to a base of the sixth HBT 6 via the sixth resistor R6. An emitter of the sixth HBT 6 is connected to the reference ground potential. A collector of the sixth HBT 6 is connected to output ends of the first-stage power detection unit and the second-stage power detection unit, and then the collector and the output ends are jointly connected to the input end of the integrated unit. One end of the eighth capacitor C8 is connected to the fifth resistor R5. The other end of the eighth capacitor C8 is connected to the emitter of the fifth HBT 5. One end of the ninth capacitor C9 is connected to the sixth resistor R6. The other end of the ninth capacitor C9 is connected to the emitter of the sixth HBT 6.

In the embodiment shown in FIG. 3, the integrated unit Sum includes a seventh HBT 7, a tenth capacitor C10, a tenth resistor R10, an eleventh resistor R11, a twelfth resistor R12, a thirteenth resistor R13. One or more of the tenth resistor R10, the eleventh resistor R11, and the thirteenth resistor R13 are thermistors. The output end of the third-stage power detection unit is connected to a base of the seventh HBT 7 in the integrated unit Sum. A collector of the seventh HBT 7 is connected to the bias voltage Vreg. An emitter of the seventh HBT 7 is connected to the reference ground potential via the eleventh resistor R11, and is connected to an output end Vout of the integrated unit Sum via the twelfth resistor R12. Two ends of the tenth resistor R10 are respectively connected to the base and collector of the seventh HBT 7. One end of the thirteenth resistor R13 is connected to the reference ground potential, and the other end of the thirteenth resistor R13 is connected to the output end Vout. One end of the tenth capacitor C10 is connected to the emitter of the seventh HBT 7, and the other end of the tenth capacitor C10 is connected to the reference ground potential.

The operating principle that the power detection circuit provided in the present invention achieves a temperature compensation function is described in detail with reference to FIG. 3:

$$V7e = (Vreg - Vbe7) - (I2 + I4 + I6) \times R10 \qquad (1)$$

$$I2 \approx (Vreg - Vbe1)/R7 \qquad (2)$$

$$I4 \approx (Vreg - Vbe3)/R8 \qquad (3)$$

$$I6 \approx (Vreg - Vbe5)/R9 \qquad (4)$$

V7e is a voltage of the emitter of the seventh HBT 7. Vreg is the bias voltage. Vbe7 is a voltage between the base and emitter of the seventh HBT 7. Vbe1 is a voltage between the base and emitter of the first HBT 1. Vbe3 is a voltage between the base and emitter of the third HBT 3. Vbe5 is a voltage between the base and emitter of the fifth HBT 5. I2, I4, and I6 are respectively output currents of the first-stage power detection unit Stage 1, the second-stage power detection unit Stage 2, and the third-stage power detection unit Stage 3.

Assuming that the bias voltage Vreg has a negative temperature coefficient, a temperature is decreased and the bias voltage Vreg is increased. In this case, the resistor R10 uses a thermistor with a negative temperature coefficient, so that a resistance value of the resistor R10 is increased. In addition, the resistor R7, the resistor R8, and the resistor R9 use thermistors with positive temperature coefficients, so that resistance values of the resistor R7, the resistor R8, and the resistor R9 are all decreased, and then I2, I4, I6 are increased. According to the foregoing formula 1, formula 2, formula 3, and formula 4, I2, I4, and I6 are all increased, so that V7$e$ is decreased, and an output voltage Vout is also decreased, thereby achieving a temperature compensation function.

Assuming that the bias voltage Vreg has a positive temperature coefficient, a temperature is decreased and the bias voltage Vreg is decreased. In this case, the resistor R10 uses a thermistor with a positive temperature coefficient, so that the resistance value of the resistor R10 is decreased. In addition, the resistor R7, the resistor R8, and the resistor R9 use thermistors with negative temperature coefficients, so that resistance values of the resistor R7, the resistor R8, and the resistor R9 are all increased, and then I2, I4, and I6 are decreased. According to the foregoing formula 1, formula 2, formula 3, and formula 4, I2, I4, and I6 are all decreased, so that V7$e$ is increased, and the output voltage Vout is also increased, thereby achieving the temperature compensation function.

Figure 4A:
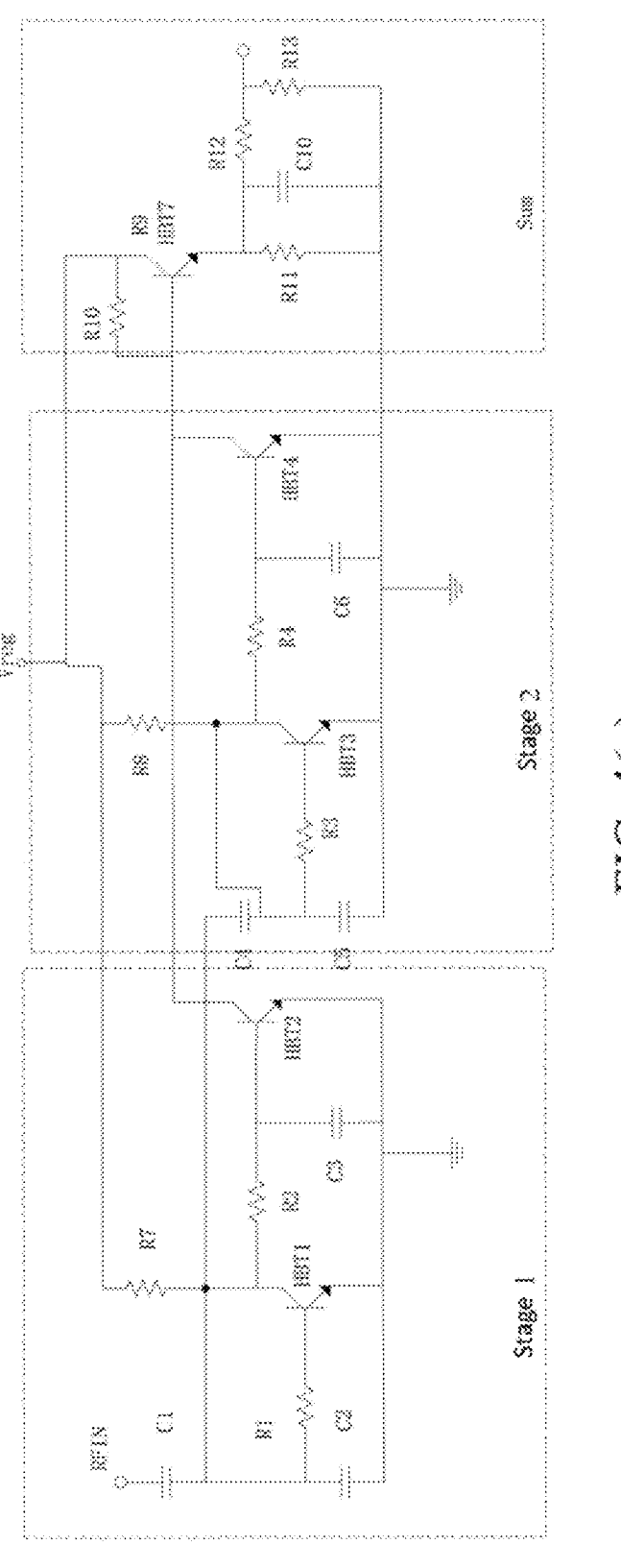
FIG. 4(a) is a schematic diagram of a circuit of another embodiment of a power detection circuit in the radio frequency front-end module as shown in FIG. 2.
Figure 4B:
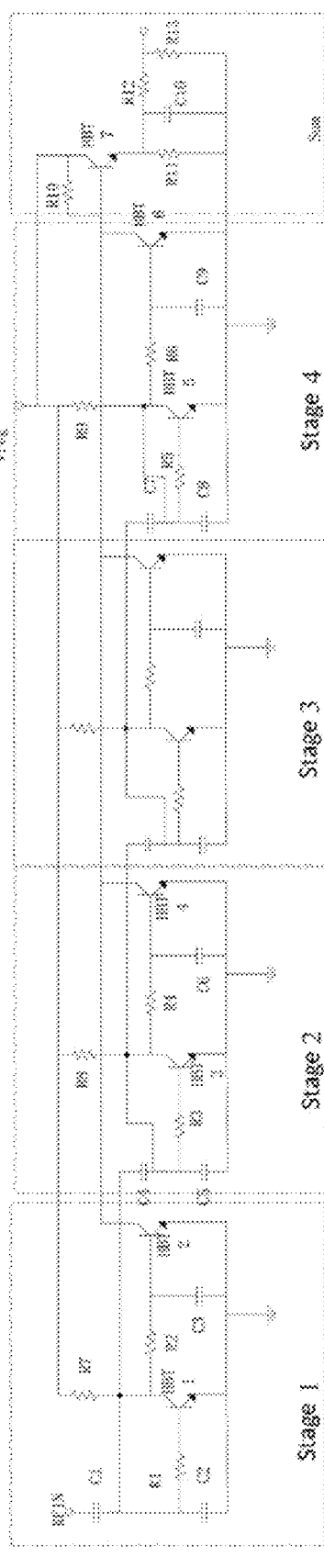
FIG. 4(b) is a schematic diagram of a circuit of still another embodiment of a power detection circuit in the radio frequency front-end module as shown in FIG. 2.

It should be noted that the power amplifier used in the foregoing embodiment has three stages of power amplification units, and a corresponding power detection circuit has three stages of power detection units. In the power detection circuit, one or more of the resistor R7, the resistor R8, the resistor R9, the resistor R10, the resistor R11, and the resistor R13 are thermistors. In other embodiments of the present invention, depending on different requirements for temperature conditions and test accuracy, the power amplifier may include two or more stages of power amplification units. The corresponding power detection circuit may include one or more stages of power detection units, and the content of the foregoing formula 1, formula 2, formula 3, and formula 4 are adjusted accordingly. For example, FIG. 4($a$) is a schematic diagram of a power detection circuit including two stages of power detection units. A collector of the second HBT in the first-stage power detection unit is used as an output end of the first-stage power detection unit and connected in parallel with a collector of a second HBT in the second-stage power detection unit, and then the collectors are jointly connected to the input end of the integrated unit. FIG. 4($b$) is a schematic diagram of a power detection circuit including four stages of power detection units. Collectors of second HBTs in the first-stage power detection unit, the second-stage power detection unit, the third-stage power detection unit, and a fourth-stage power detection unit are respectively used as output ends of the four stages of power detection units and connected in parallel to each other, and then are jointly connected to the input end of the integrated unit. In addition, in the power detection circuit, all or part of resistors connected to the bias voltage Vreg in each stage of power detection unit and the integrated unit and resistors connected to the reference ground potential in the integrated unit are thermistors.

Figure 5:
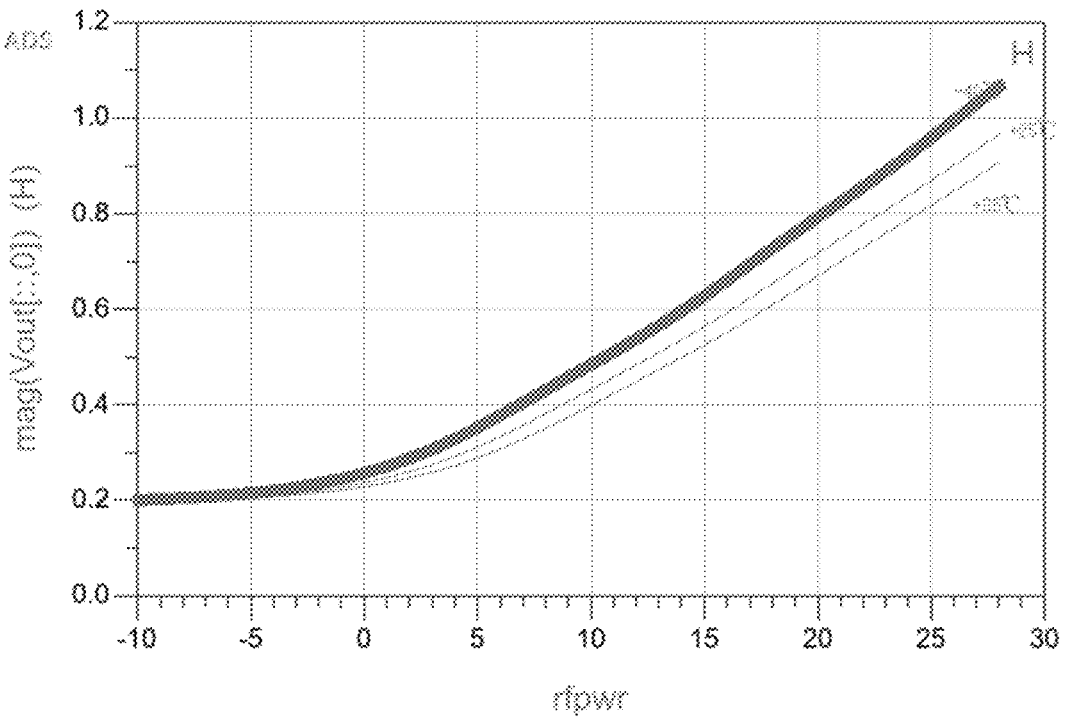
FIG. 5 is a relationship curve of input power and an output voltage of a power detection circuit without temperature compensation in an embodiment of the present invention, where a horizontal coordinate is the input power of the power detection circuit, and a vertical coordinate is the output voltage of the power detection circuit.

To embody practical technical effects of the power detection circuit and the radio frequency front-end module thereof provided in the embodiments of the present invention, the inventor performs experimental tests on the power detection circuit and the radio frequency front-end module thereof. In one of experiments, the bias voltage Vreg of the power amplifier has a negative temperature coefficient. In a conventional power detection circuit without a temperature compensation function, a relationship curve between input power and an output voltage measured is shown in FIG. 5. A horizontal coordinate is the input power of the power detection circuit, and a vertical coordinate is the output voltage of the power detection circuit. As can be learned in FIG. 5, for same input power, curves of output voltages of the power detection circuit do not coincide under different temperature conditions, resulting in different output voltages at different temperatures.

Figure 6:
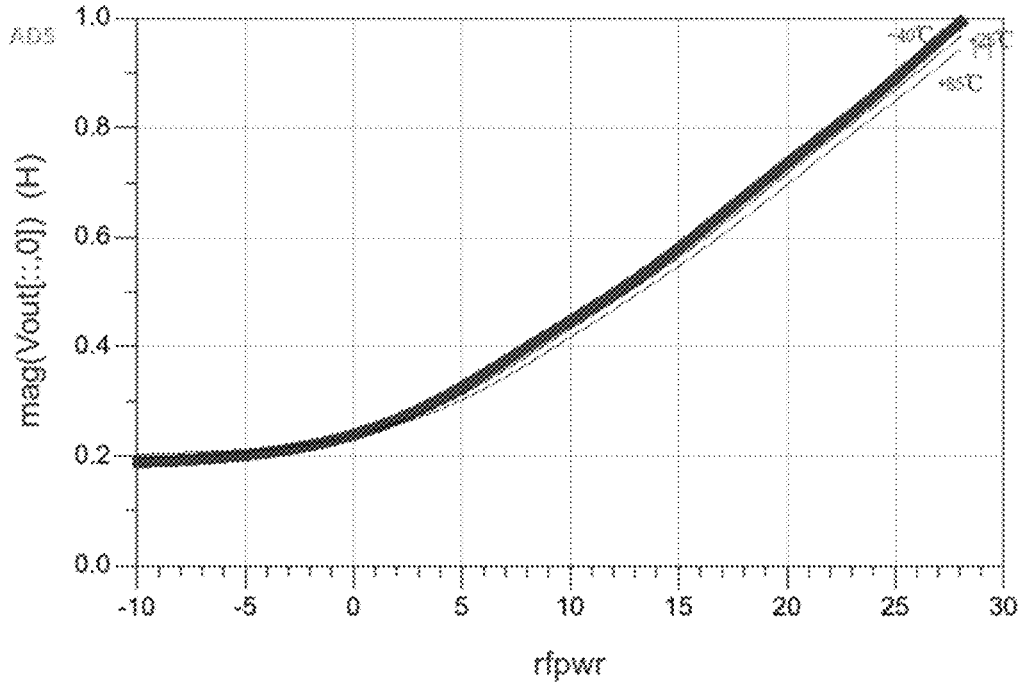
FIG. 6 is a relationship curve of input power and an output voltage of a power detection circuit having a temperature compensation function in an embodiment of the present invention, where a horizontal coordinate is the input power of the power detection circuit, and a vertical coordinate is the output voltage of the power detection circuit.

In another experiment with same other conditions, the bias voltage Vreg of the power amplifier has a negative temperature coefficient. In the power detection circuit with the temperature compensation function provided in the present invention, a relationship curve between the input power and the output voltage measured is shown in FIG. 6. A horizontal coordinate is the input power of the power detection circuit, and a vertical coordinate is the output voltage of the power detection circuit. As can be learned in FIG. 6, for same input power, curves of output voltages of the power detection circuit provided in the embodiments of the present invention basically coincide under different temperature conditions. By comparing FIG. 5 and FIG. 6, it can be learned that the technical effects of the present invention are very obvious.

The power detection circuit provided in the present invention may be applied to various radio frequency front-end modules. The radio frequency front-end module not only includes a power amplifier, a power supply circuit, and a power detection circuit, but also includes other existing conventional devices, for example, a radio frequency front-end reception link and a radio frequency front-end sending link. Details are not described here again.

In addition, the power detection circuit provided in the present invention may be further applied in an electronic device and used as an important part of a communication component. The electronic device described here refers to a computer device that can be used in a mobile environment and supports various communication standards such as GSM, EDGE, TD_SCDMA, TDD_LTE, FDD_LTE, and 5G, including a mobile phone, a notebook computer, a tablet computer, a vehicle-mounted computer, and the like. In addition, the technical solutions provided in the present invention are also applicable to other communication component applications, such as a communication base station.

Figure 7:
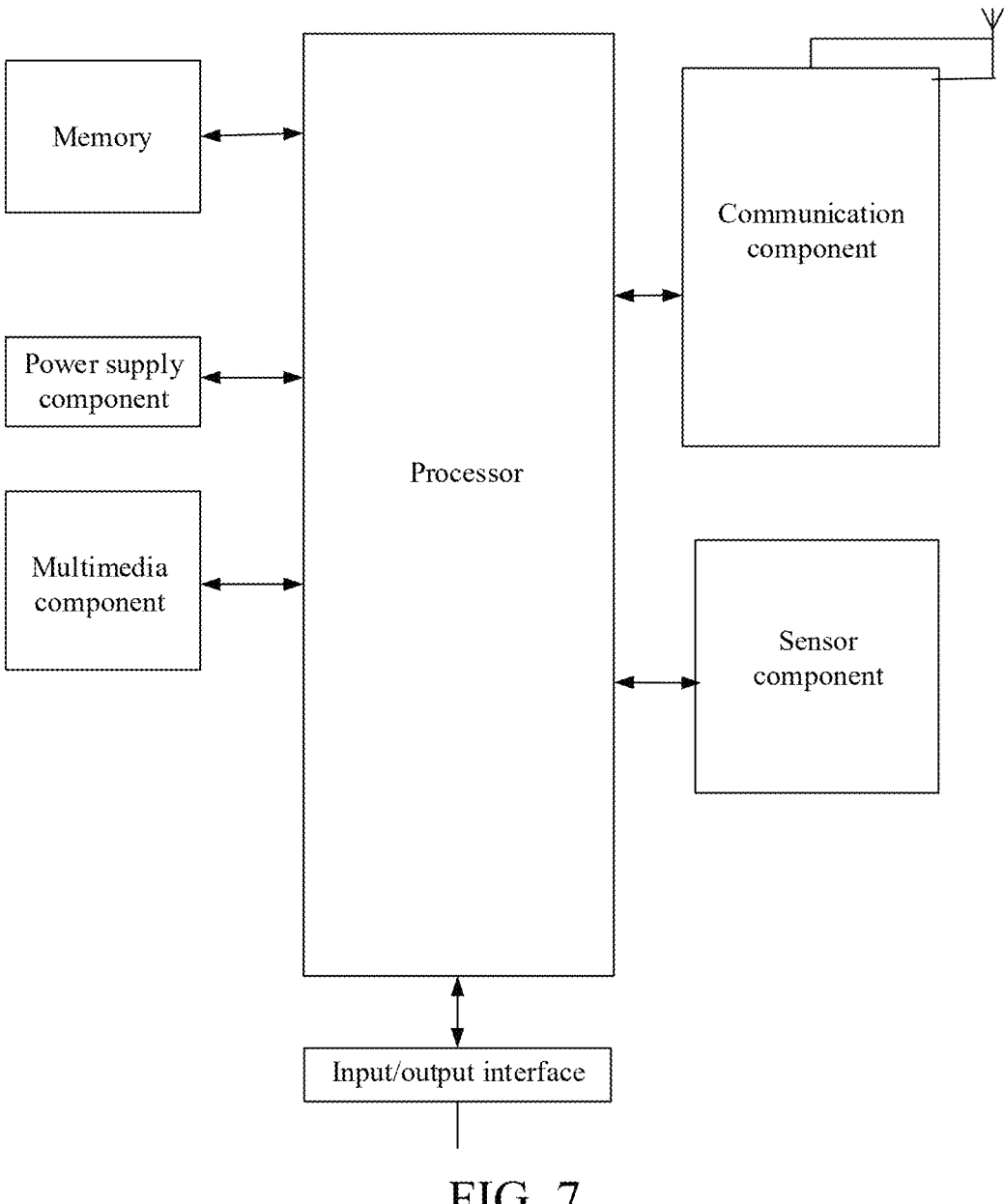
FIG. 7 is an example diagram of an electronic device using a power detection circuit provided in the present invention.

As shown in FIG. 7, the electronic device includes a processor and a memory, and may further include a communication component, a sensor component, a power supply component, a multimedia component, and an input/output interface according to actual requirements. The memory, the communication component, the sensor component, the power supply component, the multimedia component, and the input/output interface are all connected to the processor. The memory may be a static random-access memory (SRAM), an electrically erasable programmable read-only memory (EEPROM), an erasable programmable read-only memory (EPROM), a programmable read-only memory (PROM), a read-only memory (ROM), a magnetic memory, a flash memory, or the like. The processor may be a central processing unit (CPU), a graphics processing unit (GPU), a field programmable logic gate array (FPGA), an application-specific integrated circuit (ASIC), a digital signal processing (DSP) chip, or the like. Another communication component, sensor component, power supply component, multimedia component, or the like may be all implemented by general parts. Details are not specified here.

It can be learned that according to the detailed description in embodiments for the technical solutions of the present invention, the technical solutions that the power detection circuit with the temperature compensation function provided in the present invention uses a power supply circuit with a single output voltage to provide a bias power supply needed for operation for two or more stages of power amplification units and one or more stages of power detection units resolve the technical problem that requirements for temperature coefficients of bias voltages Vreg of different circuit modules are different, so that a plurality of bias voltages Vreg with different temperature coefficients are needed for power supply. Therefore, the power detection circuit and the radio frequency front-end module thereof provided in the present invention have beneficial effects such as a simple structural design, reduced production costs, and reliable performance in use.

The power detection circuit with the temperature compensation function and the radio frequency front-end module thereof provided in the present invention are described above in detail. For a person of ordinary skill in the art, any obvious modifications made to the present invention without departing from the substance of the present invention will fall within the protection scope of the patent right of the present invention.

What is claimed is:

1. A power detection circuit having a temperature compensation function, comprising at least one stage of power detection unit and an integrated unit, an input end of the integrated unit is connected to an output end of the power detection unit; wherein the power detection unit comprises a first heterojunction bipolar transistor (HBT), a second HBT, a first capacitor, a second capacitor, a third capacitor, a first resistor, a second resistor, and a seventh resistor which is a thermistor;

a signal input end of the power detection circuit is connected to a first end of the first capacitor, a second end of the first capacitor is connected to a first end of the first resistor and a collector of the first HBT, a second end of the first resistor is connected to a base of the first HBT, an emitter of the first HBT is connected to a reference ground end; the collector of the first HBT is connected to a bias voltage end via the seventh resistor, and is connected to a base of the second HBT via the second resistor; an emitter of the second HBT is connected to the reference ground end, and a collector of the second HBT is connected to the input end of the integrated unit; and a first end of the second capacitor is connected to the first end of the first resistor, and a second end of the second capacitor is connected to the emitter of the first HBT; and a first end of the third capacitor is connected to the second resistor, and a second end of the third capacitor is connected to the emitter of the second HBT.

2. The power detection circuit according to claim 1, wherein the bias voltage is a voltage having a temperature coefficient.

3. The power detection circuit according to claim 1, wherein the integrated unit comprises a seventh HBT, a tenth capacitor, a tenth resistor, an eleventh resistor, a twelfth resistor, and a thirteenth resistor; the output end of the power detection unit is connected to a base of the seventh HBT, a collector of the seventh HBT is connected to the bias voltage end, an emitter of the seventh HBT is connected to the reference ground end via the eleventh resistor, and is connected to an output end of the integrated unit via the twelfth resistor; a first end and a second end of the tenth resistor are respectively connected to the base and the collector of the seventh HBT; a first end of the thirteenth resistor is connected to the reference ground end, and a second end of the thirteenth resistor is connected to the output end of the integrated unit; and a first end of the tenth capacitor is connected to the emitter of the seventh HBT, and a second end of the tenth capacitor is connected to the reference ground end.

4. The power detection circuit according to claim 3, wherein the tenth resistor in the integrated unit and the bias voltage both have positive temperature coefficients or negative temperature coefficients.

5. The power detection circuit according to claim 4, wherein in the integrated unit, following formula is satisfied:

$$V7e = (Vreg - Vbe7) - I \times R10,$$

wherein

V7$e$ is a voltage of the emitter of the seventh HBT, Vreg is the bias voltage, Vbe7 is a voltage between the base and emitter of the seventh HBT, R10 is a resistance value of the tenth resistor, and I is an output current of the power detection unit.

6. The power detection circuit according to claim 1, wherein when the seventh resistor has a positive temperature coefficient, the bias voltage has a negative temperature coefficient; or when the seventh resistor has a negative temperature coefficient, the bias voltage has a positive temperature coefficient.

7. The power detection circuit according to claim 1, wherein when there are at least two stages of power detection units, collectors of second HBTs in the at least two stages of power detection units are used as output ends of the at least two stages of power detection units and jointly connected to the input end of the integrated unit.

8. A radio frequency front-end module, wherein the radio frequency front-end module comprises the power detection circuit according to claim 1.

9. An electronic device, comprising the power detection circuit according to claim 1.

10. The power detection circuit according to claim 2, wherein the integrated unit comprises a seventh HBT, a tenth capacitor, a tenth resistor, an eleventh resistor, a twelfth resistor, and a thirteenth resistor; the output end of the power detection unit is connected to a base of the seventh HBT, a collector of the seventh HBT is connected to the bias voltage end, an emitter of the seventh HBT is connected to the reference ground end via the eleventh resistor, and is connected to an output end of the integrated unit via the twelfth resistor; a first end and a second end of the tenth resistor are respectively connected to the base and the collector of the seventh HBT; a first end of the thirteenth resistor is connected to the reference ground end, and a second end of the thirteenth resistor is connected to the output end of the integrated unit; and a first end of the tenth capacitor is connected to the emitter of the seventh HBT, and a second end of the tenth capacitor is connected to the reference ground end.

11. The power detection circuit according to claim 10, wherein the tenth resistor in the integrated unit and the bias voltage both have positive temperature coefficients or negative temperature coefficients.

12. The power detection circuit according to claim 11, wherein in the integrated unit, following formula is satisfied:

$$V7e = (Vreg - Vbe7) - I \times R10, \qquad 5$$

wherein

V7$e$ is a voltage of the emitter of the seventh HBT, Vreg is the bias voltage, Vbe7 is a voltage between the base and emitter of the seventh HBT, R10 is a resistance value of the tenth resistor, and I is an output current of the power detection unit.

\* \* \* \* \*